United States Patent [19]

Schuetz et al.

[11] Patent Number: 4,701,634
[45] Date of Patent: Oct. 20, 1987

[54] INTEGRATED CIRCUIT FOR THE EMISSION OF A VOLTAGE WHICH ALTERNATES BETWEEN POSITIVE AND NEGATIVE VOLTAGE LEVELS

[75] Inventors: Alfred Schuetz, Zorneding; Wolfgang Müller; Ewald Soutschek, both of Putzbrunn, all of Fed. Rep. of Germany

[73] Assignee: Siemens Aktiengesellschaft, Berlin and Munich, Fed. Rep. of Germany

[21] Appl. No.: 750,302

[22] Filed: Jul. 1, 1985

[30] Foreign Application Priority Data

Jul. 2, 1984 [DE] Fed. Rep. of Germany ....... 3424274

[51] Int. Cl.$^4$ ............. H03K 19/096; H03K 5/13; H03K 17/687
[52] U.S. Cl. ............................... 307/269; 307/452; 307/576
[58] Field of Search ............... 307/269, 445, 451, 452, 307/576, 581, 583; 330/262–264

[56] References Cited

U.S. PATENT DOCUMENTS 4,122,360 10/1978 Kawagai et al. ................ 307/452

FOREIGN PATENT DOCUMENTS 2744209 4/1979 Fed. Rep. of Germany .

OTHER PUBLICATIONS

"CMOS Schmitt Trigger Circuit", IBM Technical Disclosure Bulletin, vol. 29, No. 3, Aug. 1985.
RCA Technical Notes, "Improved COS/MOS Inverter Circuit for Reducing Burn-Out and Latch Up", Andrew G. F. Pingwall, Tn No. 1230, pp. 4, Jul. 25, 1979.

Primary Examiner—Stanley D. Miller
Assistant Examiner—B. P. Davis
Attorney, Agent, or Firm—Hill, Van Santen, Steadman & Simpson

[57] ABSTRACT

An integrated circuit for emitting a clock voltage $V_A$ which alternates between positive and negative voltage levels with the clock voltage being controllable by means of a unipolar clock voltage $V_E$ and wherein the circuit is a very simple small semiconductor arrangement which has three series connected field effect transistors T1, T2 and T3 with the first end of the series arrangement receiving a first reference voltage and the other end of the series arrangement receiving a second reference voltage. The first and second field effect transistors 1 and 2 or first and second channel types and have gate terminals which are commonly connected to the control input $V_E$ and the junction point 3 of the first two field effect transistors T1 and T2 connected to the output terminal and also connected by way of a capacitor to the gate of the third field effect transistor T3 which is of the first channel type. The gate of the third field effect transistor T3 is connected by way of a diode D or an additional field effect transistor T4 of the first channel type which has its gate connected to the second reference voltage potential.

6 Claims, 4 Drawing Figures

INTEGRATED CIRCUIT FOR THE EMISSION OF A VOLTAGE WHICH ALTERNATES BETWEEN POSITIVE AND NEGATIVE VOLTAGE LEVELS

BACKGROUND OF THE INVENTION

1. Field of the Invention:

The invention relates in general to an integrated circuit for producing a clock voltage which varies between positive and negative voltage levels.

2. Description of the Prior Art

A circuit of this type is disclosed in DE-A No. 27 44 209. In this circuit unipolar clock voltage is supplied to an input which is connected through an inverter and a first capacitor to the first input of a first NOR gate and by way of a second capacitor to the first input of a second NOR gate whereby each of these gates is electrically connected with its output to the second input of the respective other gate. The first inputs of both NOR gates are also connected through load elements to a terminal carrying the negative voltage level and the positive voltage level is supplied to the NOR gates as a supply voltage. One of the gate outputs forms the output of the circuit. Such circuit however is relatively complicated.

SUMMARY OF THE INVENTION

It is an object of the present invention to provide an integrated circuit for producing a clock voltage which alternates between positive and negative voltage levels which is simpler than the prior art known circuit and requires less semiconductor area. The invention is achieved by providing a series circuit of three field effect transistors T1, T2 and T3 with a supply voltage connected to one end of the series circuit and a second supply voltage connected to the other end of the series circuit and wherein the first and second field effect transistors T1 and T2 are first and second channel types and have their gate terminals connected together and to a common control input which receives the unipolar clock voltage and whereas the junction of the first two transistors is connected to an output terminal and is connected by way of a capacitor to the gate of the third field effect transistor T3 which is of the first channel type. The gate of the third field effect transistor is connected by way of a diode to the second reference potential.

The advantages of the circuit of the invention is that a significantly smaller number of circuit elements is required than circuits of the prior art and only one capacitor is utilized.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
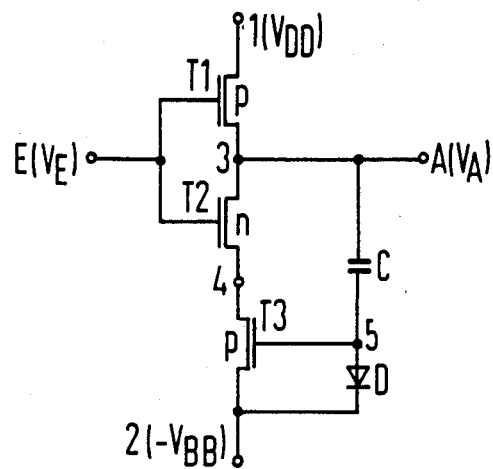
FIG. 1 is an electrical schematic of the invention.

FIG. 1 illustrates a first embodiment of the invention wherein a first field effect transistor T1 of the p-channel enhancement type has a first terminal connected to an input terminal 1 which receives a reference voltage $V_{VDD}$. The other terminal of the field effect transistor T1 is connected to a terminal of a second field effect transistor T2 of the second n-channel enhancement type. For example, transistor T1 may be of the p-channel enhancement type and transistor T2 may be of the n-channel enhancement type. The other terminal of transistor T2 is connected to a terminal of a field effect transistor T3 of the first channel enhancement type or in the illustrated example may be a p-channel enhancement type. The output terminal of the transistor T3 is connected to a terminal 2 which is connected to a suitable supply voltage $-V_{BB}$. The gates of the transistors T1 and T2 are connected together and are connected to a common input terminal E which receives a voltage $V_E$. The junction point between the transistors T1 and T2 is connected to an output terminal A where the output voltage $V_A$ appears. The output terminal A is connected by way of capacitor C to circuit point 5 which is connected to the gate of transistor T3. Circuit point 5 is connected through diode D to output terminal 2 as illustrated.

When a positive supply voltage $V_{DD}$ is connected to the terminal 1 and a negative voltage 31 $V_{BB}$ is connected to the end terminal 2, then an output voltage $V_A$ will appear at output terminal A which alternates between the voltage levels $V_{DD}$ and $-V_{BB}$. This comprises a clock voltage $V_A$ which is the converted voltage $V_E$ which is supplied at terminal E which alternates between a positive voltage and a reference voltage.

Figure 2:
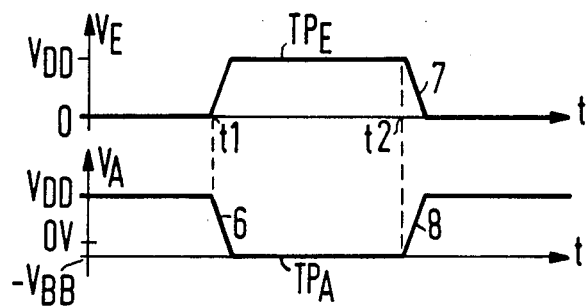
FIG. 2 illustrates voltage time diagrams for explaining the invention.

The upper curve in FIG. 2 illustrates the time variation of the clock voltage $V_E$. Before time t1, this voltage has an amplitude of zero volts. For this reason, transistor T1 will be conductive during the period from 0 to t1 and transistor T2 will be non-conductive. During this time, the positive voltage level $V_{DD}$ will be through-connected through transistor T1 from terminal 1 to the output terminal A. This is illustrated in the lower curve in FIG. 2. Potential of the circuit point 4 which is the junction point between transistors T2 and T3 will be slowly lowered due to the conductive field effect transistor T3 until it is higher than the potential of the circuit point 5 by the value of the threshold voltage of transistor T3. The potential of the circuit point 5 lies higher than the negative voltage $-V_{BB}$ at terminal 2 by an amount equal to the value of the front threshold voltage of the diode D. When circuit point 4 reaches this minimum potential, then T3 will be turned off.

Due to the leading edge of a clock pulse $TP_E$ of $V_E$ which occurs at time t1, the potential at E will be increased to $V_{DD}$ which causes transistor T1 to be non-conductive and transistor T2 is switched into the conductive condition. By way of transistor T2 the potential at output terminal A is then first lowered to the value to which the circuit point 4 had been sent. The negative voltage discontinuity appearing at terminal A is transmitted by capacitor C to the circuit point 5 and the result is that transistor T3 will be switched to the ON condition. The potential at terminal A is then reduced by way of the conductive transistors T2 and T3 to the value of $-V_{BB}$ which is indicated in FIG. 2 by the trailing edge 6 in the lower curve of FIG. 2 which illustrates the output voltage $V_A$. The negative amplitude value $-V_{BB}$ of the output voltage $V_A$ remains maintained until the trailing edge 7 of the clock pulse $TP_E$ starts at time t2. This shifts the potential at terminal E back to zero volts so that transistor T2 becomes non-conductive and transistor T1 becomes conductive. The potential at terminal A is increased to $V_{DD}$ by way of the conductive transistor T1 and this is indicated in the lower curve of FIG. 2 by the curve portion 8. The positive voltage discontinuity occurring at terminal A is transmitted by capacitor C to the circuit point 5 which causes transistor T3 to be turned to the off condition. As a result of the positive voltage discontinuity occurring at circuit point 5 the diode D is turned on and this again leads to a reduction of the potential at terminal point 5 which differs from $-V_{BB}$ only by the value of the front threshold voltage of the diode D. Diode D turns off when this minimum is reached and the initial condition is then reestablished.

FIG. 2 illustrates the clock pulse $TP_A$ of the output voltage $V_A$ which is generated in the circuit of FIG. 1 and the output voltage $V_A$ is switched from the positive voltage level of $V_{DD}$ to the negative voltage level of $-V_{BB}$ and is then switched back to the level $V_{DD}$. Switching and switching back occurs simultaneously with appearance of the leading and trailing edges of the unipolar clock pulse $TP_E$, in other words, at times t1 and t2. When the clock voltage $V_E$ comprises a series of clock pulses $TP_E$ then a clock voltage having a corresponding plurality of clock pulses $TP_A$ appears at terminal A.

Figure 3:
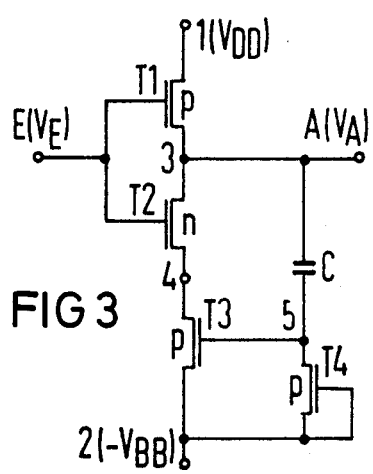
FIG. 3 is a second embodiment of the invention.

FIG. 3 illustrates a second embodiment of the invention which differs from FIG. 1 only in that the diode D between circuit point 5 and circuit point 2 has been replaced by a fourth field effect transistor T4 of the p-channel enhancement type with its main terminals connected between terminal points 5 and 2 and its gate connected to terminal 2. The remaining circuit components of FIG. 3 are identical to those illustrated in FIG. 1 and have the same reference characters and will not be redescribed.

The circuit of FIG. 3 operates similar to that of circuit of FIG. 1 wherein the field effect transistor T4 is always switched on when the rising edge 8 of the voltage $V_A$ occurs which is a positive voltage discontinuity which is transmitted to the circuit point 5. By way of the conductive transistor T4, the potential at circuit point 5 is lowered to a minimum value subsequently thereto, this minimum value being higher than that of the potential $-V_{BB}$ at terminal 2 by the value of the threshold voltage of transistor T4. The minimum potential value at terminal point 5 obtainable with transistor T4 roughly corresponds to the minimum value obtainable with the diode D2 in the circuit of FIG. 1.

Figure 4:
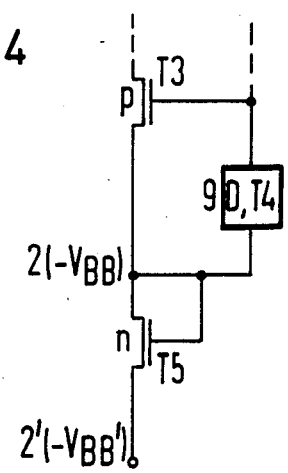
FIG. 4 illustrates an alternative arrangement for the circuits of FIGS. 1 and 3.

FIG. 4 illustrates an alternate arrangement for the circuits of FIGS. 1 and 3 wherein a field effect transistor T5 of the n-channel enhancement type is connected between terminal 2 and an additional terminal 2' which is electrically connected to the negative voltage level $-V_{BB}'$. When a circuit according to FIG. 1 is modified as illustrated in FIG. 4, the block 9 comprises the diode D and when the circuit of FIG. 3 is modified according to the embodiment of FIG. 4 the element 9 comprises the transistor T4. The gate of transistor T5 is connected to terminal 2. When the potential $-V_{BB}'$ at terminal 2' is selected such that it is more negative than the previously mentioned potential $-V_{BB}$ by the value of the threshold voltage of transistor T5 then $-V_{BB}$ will occur at terminal 2 of FIG. 4 and the previously described output voltage $V_A$ also occurs with the circuit of FIG. 4 as a function of the voltage $V_E$. In contrast to the circuits of FIGS. 1 and 3, however, in FIG. 4, a negative voltage level $-V_{BB}'$ is now necessary which is more negative than the minimum value of the output voltage $V_A$ by the threshold voltage of transistor T5 and this output voltage $V_A$ corresponds to the potential $-V_{BB}$ illustrated in FIG. 2. When the substrate on which the integrated circuit of the invention is constructed is connected to the potential $-V_{BB}'$, then the output voltage $V_A$ can never become more negative then the substrate bias voltage $-V_{BB}'$ even when there is superimposition of noise voltages which have amplitudes that never exceeds the value of the threshold voltage of transistor T5. Thus, there is avoided with great reliability that the pn junction between the individuals n-conductive semiconductor zones in which the p-channel field effect transistors of the circuit are mounted and the p-conductive substrate are biased in the conducting direction which would result in a deterioration of the isolation between the individual circuit components.

In addition to the embodiments described herein, further embodiments are of interest in which the input voltage E is supplied with a unipolar clock voltage which alternates between a negative voltage level and the reference potential. For such embodiments the field effect transistors T1, T3 and under certain conditions T4 are selected as field effect transistors of the n-channel enhancement type and transistor T2 and under given conditions transistor T5 are selected to be of the p-channel enhancement type. The negative voltage level $-V_{BB}$ in this case is applied to terminal 1 and the positive voltage level $V_{DD}$ is applied to terminal 2. The output voltage $V_A$ will then have a shape which is the reverse to that illustrated in FIG. 2 whereby the amplitude value $-V_{BB}$ appears before the time t1 with this amplitude value being switched to the value $V_{DD}$ after the time t1 and reswitches to $-V_{BB}$ which continues to occur after time t2. The voltage level $-V_{BB}'$ at circuit point 2' of FIG. 4 in this additional embodiment is replaced by a voltage level of $V_{DD}'$ which is more positive than the voltage $V_{DD}$ by the amount of the threshold voltage of transistor T5.

An important application of the circuit of the invention is to generate a voltage which alternates between a positive voltage level, for example, five volts and a negative voltage level as, for example, $-2$ volts which is applied to the word lines of RAM semiconductor memories for the selection of individual memory cells. The p-channel selection transistors of the individual memory cells selectable by way of word lines are switched on upon appearance of the $-2$ volt level of this voltage whereas they are inhibited when the five volt level occurs. The storage capacitor of every selected memory cell is thereby connected to an allocated bit line by way of its transmissively switched selection transistor. When it is assumed that the bit line lies at 0 volts, then given a voltage of for example $-2$ volts which is supplied via the word line to the gate of the p-channel selection transistor, the storage capacitor previously charged the five volts can be discharged to zero volts without difficulty. If by contrast the gate of the selection transistor were to be charged with a voltage of 0 volts then given conditions that are otherwise identical, a discharge of the storage capacitor only to a voltage of about 1 volt would be possible since the selection transistor which has a threshold voltage of roughly one volt would then already inhibit. It is a great advantage in the present invention that a voltage alternating between five volts and zero volts on the word line is replaced by a voltage which alternates between five volts and −2 volts. The circuits illustrated in FIGS. 1, 3 and 4 accomplish this and result in a substantial improvement of prior art devices.

Although the invention has been described with respect to preferred embodiments, it is not to be so limited as changes and modifications can be made which are within the full intended scope of the invention as defined by the appended claims.

We claim as our invention:

1. An integrated circuit for producing a clock voltage which alternates between a positive and a negative voltage level, comprising a voltage source with positive and negative voltage, a series circuit of first, second and third field effect transistors (T1, T2, T3) having gates with gate terminals, first and second end terminals (1, 2) of said series circuit electrically connected across said voltage source which has voltage equal to said positive and negative voltage levels, said first and second field effect transistors (T1, T2) of said series connection respectively being of first and second channel conductivity types and their gate terminals connected to a common control input (E) which receives a unipolar clock voltage, a junction point (3) between said first and second transistors connected to a circuit output terminal (A), a capacitor (C) connected between said junction point (3) and the gate of said third field effect transistor (T3) which is of a first channel conductivity type, a diode, and the gate of said third field effect transistor (T3) connected to said diode (D) and the other side of said diode connected to said second end terminal (2) of said series circuit allocated to said third field effect transistor.

2. An integrated circuit for producing a clock voltage which alternates between a positive and a negative voltage level, comprisingb, a voltage source with positive and negative voltage levels, a series circuit of first, second and third field effect transistors (T1, T2, T3) having gates with gate terminals, first and second end terminals (1, 2) of said series circuit electrically connected across said voltage source which has voltages equal to said positive and negative levels, said first and second field effect transistors (T1, T2) of said series connection respectively being of first and second channel conductivity types and their gate terminals connected to a common control input (E) which receives a unipolar clock voltage, a junction point (3) between said first and second transistors connected to the circuit output (A), a capacitor (C) connected between said junction point (3) and the gate of the third field effect transistor (T3) which is of a first channel conductivity type, a fourth field effect transistor (T4) with a gate and gate terminal connected between the gate of said third field effect transistor (T3) and said second end terminal (2) allocated to said third field effect transistor, the gate of said fourth field effect transistor (T4) connected to said second end terminal (2).

3. An integrated circuit according to claim 1 comprising a fourth field effect transistor (T5) with a gate and gate terminal said second end terminal (2) of said series circuit connected to said third field effect transistor (T3) and electrically connected to the source-drain of said fourth field effect transistor (T5) which is a second channel conductivity type a different voltage source connected to said fourth field effect transistor and the gate of said fourth field effect transistor (T5) connected to said second end terminal (2) of said series connection.

4. An integrated circuit according to claim 2 comprising a fifth field effect transistor (T5) with a gate, a source and a drain and a gate terminal and said second end terminal (2) of said series circuit connected to said third field effect transistor (T3) and electrically connected to said source-drain of said fifth effect transistor (T5) which is a second channel conductivity type, and a different voltage source connected to said fifth field effect transistor, and the gate of said fifth field effect transistor (T5) connected to said second end terminal (2) of said series connection.

5. An integrated circuit according to claim 2, wherein the positive voltage level from said voltage source is applied to said first end terminal (1) and to said first field effect transistor (T1), said first, third and said fourth field effect transistors (T1, T3, T4) are p-channel enhancement types and said second (T2) field effect transistor is an n-channel enhancement type; and said unipolar clock voltage alternates between a positive voltage value and a reference potential.

6. An integrated circuit according to claim 2, wherein the negative voltage level from said voltage source is applied to said first end terminal (1) and to said first field effect transistor (T1), said first, said third said fourth field effect transistors (T1, T3, T4) are n-channel enhancement types and said second field effect transistor is of a p-chanel enhancement type; and said unipolar clock voltage alternates between a negative voltage value and a reference potential.

* * * * *